(12) United States Patent
Kagaya et al.

(10) Patent No.: US 7,593,650 B2
(45) Date of Patent: Sep. 22, 2009

(54) OPTICAL RECEIVER

(75) Inventors: Osamu Kagaya, Tokyo (JP); Michihide Sasada, Yokohama (JP)

(73) Assignee: Opnext Japan, Inc., Kanagawa (JP)

( * ) Notice: Subject to any disclaimer, the term of this patent is extended or adjusted under 35 U.S.C. 154(b) by 564 days.

(21) Appl. No.: 11/454,874

(22) Filed: Jun. 19, 2006

(65) Prior Publication Data
US 2007/0177884 A1 Aug. 2, 2007

(30) Foreign Application Priority Data
Feb. 2, 2006 (JP) .............................. 2006-025367

(51) Int. Cl.
*H04B 10/06* (2006.01)
(52) U.S. Cl. ..................................... 398/202
(58) Field of Classification Search .......... 398/202–214
See application file for complete search history.

(56) References Cited

U.S. PATENT DOCUMENTS

| 5,745,276 | A | 4/1998 | Ho et al. | |
|---|---|---|---|---|
| 6,255,905 | B1 * | 7/2001 | Gehrt | 330/107 |
| 2005/0008303 | A1 | 1/2005 | Nishie et al. | |
| 2005/0168957 | A1 * | 8/2005 | Kawauchi et al. | 361/749 |
| 2005/0221779 | A1 * | 10/2005 | Okanobu | 455/253.2 |
| 2005/0281514 | A1 | 12/2005 | Oki et al. | |
| 2006/0002663 | A1 | 1/2006 | Posamentier | |
| 2006/0018669 | A1 * | 1/2006 | Tanaka | 398/202 |

FOREIGN PATENT DOCUMENTS

| GB | 2 105 543 | 3/1983 |
|---|---|---|
| JP | 2005-217284 | 8/2005 |

OTHER PUBLICATIONS

Yoshinori Sunaga et al., "2 GBIT/S Small Form Factor Fiber-Optic Transceiver for Single Mode Optical Fiber", IEEE Transactions on Advanced Packaging, vol. 23, No. 2, May 2000.
Search Report dated Jun. 1, 2007 in European Patent Application No. 06 010 831.3.

* cited by examiner

*Primary Examiner*—Quan-Zhen Wang
(74) *Attorney, Agent, or Firm*—McDermott Will & Emery LLP

(57) ABSTRACT

There is provided an optical receiver in which, between an optical receiver sub-assembly and a pre-amplifier on a main printed circuit board, two transmission lines on a flexible printed circuit board for connecting an optical receiver module with the main printed circuit board, a balanced-type attenuator circuit composed of four resistor elements, and two capacitor elements connected in parallel with the balanced-type attenuator circuit are provided.

4 Claims, 4 Drawing Sheets

OPTICAL RECEIVER

CLAIM OF PRIORITY

The present application claims priority from Japanese patent application serial no. 2006-025367, filed on Feb. 2, 2006, the content of which is hereby incorporated by reference into this application.

BACKGROUND OF THE INVENTION

The present invention relates to an optical receiver, and particularly to an optical receiver in which a flexible printed circuit board is used for transmission lines between a pre-amplifier and a post-amplifier.

An optical receiver module in which a semiconductor photodiode is used as a receiver element is one of the key devices of transceivers for optical fiber transmission. With the recent spread of broadband networks, optical transceivers have increased in speed and the optical transceivers with a bit rate of up to 10 Gbits/s are beginning to be widely used. The optical receiver modules suitable for the above-mentioned application are required to be downsized and manufactured at low cost.

JP-A No. 2005-217284 discloses an optical transceiver in which an optical receiver sub-assembly is downsized and can be manufactured at low cost by incorporating a semiconductor photodiode and a pre-amplifier in a CAN-type package. In the optical transceiver, connecting of the optical receiver sub-assembly to a main printed circuit board through a flexible printed circuit board allows for absorption of stress caused by dimensional deviation or by deformation due to temperature fluctuations, thereby preventing a stress-generated defect.

However, in the optical receiver disclosed in JP-A No. 2005-217284, an in-band gain reduction occurs while an electrical signal output from the optical receiver sub-assembly reaches a post-amplifier on the main printed circuit board. As a result, there is a problem that SRS (Stressed Receiver Sensitivity) which is one of the evaluation indexes of receiver sensitivity of optical transceivers for 10 Gbits/s Ether is deteriorated. Here, SRS is an indicator to evaluate whether an optical signal after transmission is properly received under the condition that a transmission electrical signal is superimposed with noise in advance. In order to improve SRS, it is preferable to make a small signal gain at around 5 GHz larger than a small signal gain at DC by about 0.5 dB.

"ROSA for 10 Gbps Optical Transmission" of Eudyna Devices Inc. shows a 10 Gbits/s optical receiver sub-assembly including a flexible printed circuit board for connecting a main printed circuit board.

The flexible printed circuit board used in the prior art employs a thin board in order to obtain flexibility. There is ordinarily used the flexible printed circuit board formed by applying a copper foil having an about 30 μm thickness on each of both faces of a polyimide membrane having an about 50 μm thickness. In the case of forming transmission lines with a characteristic impedance of 50 Ω in a microstrip format on the flexible printed circuit board, each of the line widths needs to be extremely thin, like about 80 μm. Therefore, a transmission loss on the flexible printed circuit board becomes a considerable amount. The calculation of the amount of transmission loss in the transmission lines shows that 0.12 dB/cm is for dielectric loss at a frequency of 10 GHz and 0.28 dB/cm is for conductor loss at a frequency of 10 GHz, so that a transmission loss of 0.40 dB/cm is expected in total. The transmission loss increases substantially proportional to a frequency. For example, in the case where the flexible printed circuit board 2 cm in length is connected to the optical receiver sub-assembly, in-band gain reduction from DC to 5 GHz is increased by 0.4 dB throughout the flexible printed circuit board. In addition to this, bandwidth deterioration is increased at discontinuous parts in a connected portion between the flexible printed circuit board and the main printed circuit board, and a connected portion between the flexible printed circuit board and the optical receiver sub-assembly.

A pre-amplifier IC such as the optical receiver sub-assembly incorporated in the optical receiver module is generally designed such that the in-band characteristic up to an IC output portion is made flat. As a result, in-band gain reduction of at least 0.4 dB or more normally occurs from DC to 5 GHz in an input portion of the post pre-amplifier on the main printed circuit board.

As a method of compensating the gain reduction, there is devised means for altering the flat in-band characteristic up to the output portion of the pre-amplifier IC into the in-band characteristic in which the gain is increased according to a frequency by customizing mounting conditions within the optical receiver sub-assembly. According to a study by the inventors, making longer a grounding wire of an input circuit portion of a pre-amplifier, or making longer a connection wire between a pre-amplifier and an optical receiver element (APD or PIN-PD) or between an optical receiver element and an RF ground capacitor allows for boost of the frequency characteristic, thereby obtaining a desired characteristic from DC to 5 GHz.

However, departing from the normal operation of the pre-amplifier, the pre-amplifier is operated such that gain peaking is applied at a high frequency and as a result, the instability of the circuit is enhanced. Consequently, when voltage and temperature are changed within a range of conditions necessary for guarantee of proper operations, there is a case that a defect such as oscillation of the optical receiver sub-assembly occurs under the conditions of high power voltage and low operation temperature. Further, even in the case where no oscillation occurs, the unnecessary gain peak is increased at a high frequency, which causes a problem in the reception characteristics of the optical transceiver in many cases.

As described above, for the stability of manufacturing the optical transceiver, it has been desired that the pre-amplifier is operated in a state where no unreasonable peaking is applied within the optical receiver sub-assembly and that the in-band gain reduction on the flexible printed circuit board is compensated after output from the optical receiver sub-assembly.

SUMMARY OF THE INVENTION

The present invention proposes a structure of an optical receiver which can achieve a good reception characteristic, and provides an optical receiver which is downsized and is manufactured at low cost.

The above-mentioned problem can be solved by an optical receiver including a light receiving element for converting an optical signal into an electrical signal, a first amplifier for amplifying an output signal from the light receiving element, and a second amplifier for further amplifying an output from the first amplifier, wherein there is provided a frequency characteristic compensating circuit that is configured by a plurality of passive elements and that is provided between the first amplifier and the second amplifier.

Further, the above-mentioned problem can be solved by an optical receiver including an optical receiver sub-assembly having a light receiving element for converting an optical signal into an electrical signal and a first amplifier for amplifying an output signal from the light receiving element, and a main printed circuit board mounting a second amplifier for further amplifying an output from the first amplifier, wherein the optical receiver sub-assembly and the main printed circuit board are connected through a flexible printed circuit board for transmitting the electrical signal amplified by the first amplifier, and there is provided a frequency characteristic compensating circuit that is configured by a plurality of passive elements and that is provided between a flexible printed circuit board connected portion and the second amplifier on the main printed circuit board.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Figure 1:
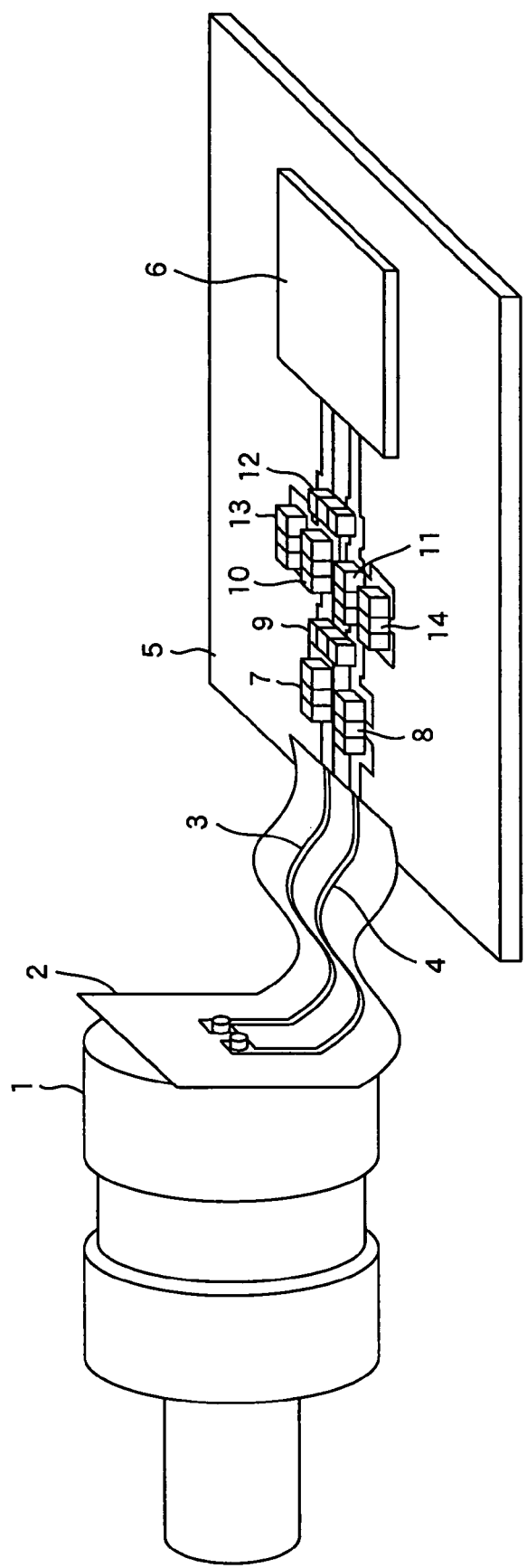
FIG. 1 is a perspective view depicting main parts of an optical receiver.

Hereinafter, the embodiment of the present invention will be described using examples with reference to the drawings. It should be noted that substantially identical portions are given the same reference numeral, and the explanation thereof is not repeated.

EXAMPLE 1

Figure 2:
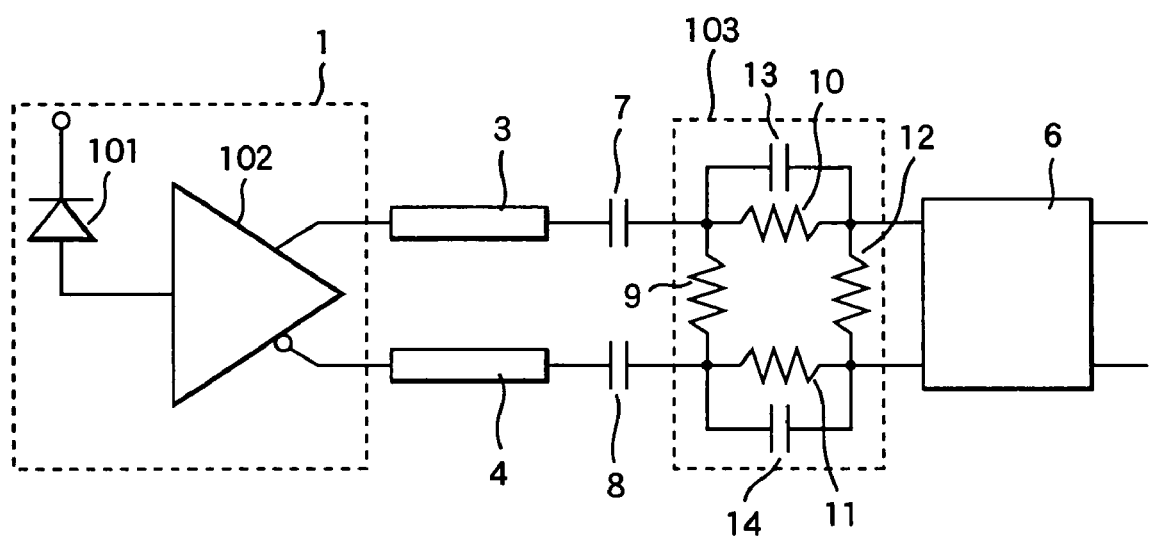
FIG. 2 is a circuit diagram for explaining the optical receiver from a photodiode to a post-amplifier.
Figure 3A:
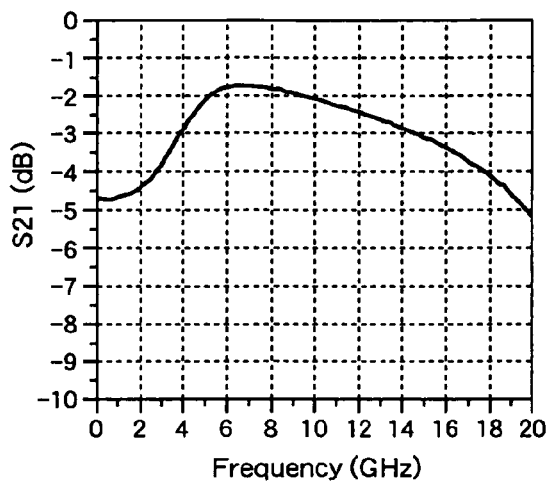
FIGS. 3A and 3B are graphs showing characteristics of a frequency characteristic compensating circuit.
Figure 3B:
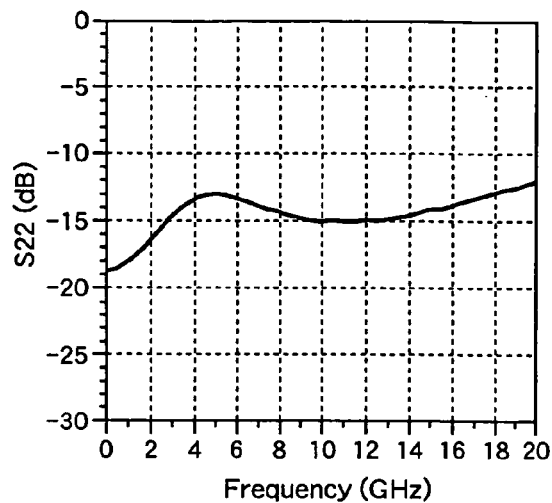
Figure 4A:
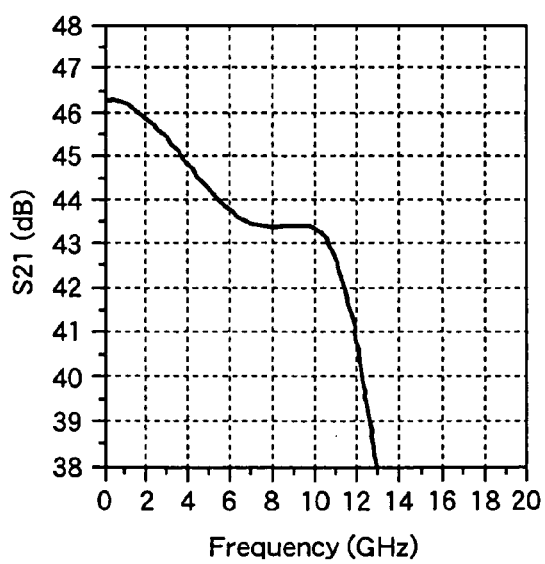
FIGS. 4A and 4B are graphs explaining effects and showing frequency characteristics.
Figure 4B:
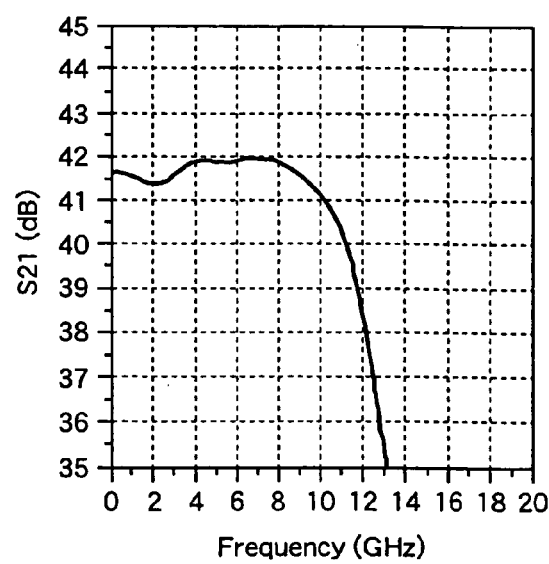

Example 1 will be described with reference to FIG. 1 to FIGS. 4A and 4B. FIG. 1 is a perspective view depicting main parts of an optical receiver with a transmission speed of 10 Gbits/s. FIG. 2 is a circuit diagram for explaining the optical receiver from a photodiode to a post-amplifier. FIG. 3 is a graph showing characteristics of a frequency characteristic compensating circuit. FIG. 4 is a graph explaining effects and showing frequency characteristics.

In FIG. 1, the main parts of the optical receiver are configured by an optical receiver sub-assembly 1, a main printed circuit board 5, and a flexible printed circuit board 2 connecting therebetween while having flexibility.

The optical receiver sub-assembly 1 converts an optical modulation signal incident from the left side into an electrical signal so as to output a differential signal. The differential signal is output to transmission lines 3 and 4 on the flexible printed circuit board 2 via two output lead pins. The output signal passes through DC cut capacitors 7 and 8, resistors 9, 10, 11, and 12 configuring a balanced-type attenuator circuit, and capacitors 13 and 14 connected in parallel with the balanced-type attenuator circuit via a wiring pattern on the main printed circuit board 5, and thereafter is input to a post-amplifier 6.

As a case of the optical receiver sub-assembly 1, a CAN-type metal package case is used. The metal package case is used as a ground potential in the electrical sense. As the CAN-type metal package case, for example, a TO-CAN type case having a diameter of 5.3 mm, or the like is used. Inexpensive iron is preferably used as a material for low-cost.

The flexible printed circuit board 2 to be used is formed by applying a copper foil about 30 µm in thickness on each of both faces of a polyimide membrane about 50 µm in thickness. Further, a cover lay 40 µm in thickness is applied on each of the both faces as a protective film. The transmission lines 3 and 4 are formed in microstrip lines in which the copper foil on the front face serves as a strip conductor and the copper foil on the rear face serves as a ground conductor. The widths of the transmission lines 3 and 4 are respectively set at 80 µm so that the characteristic impedance becomes 50Ω. Although not shown in FIG. 1 for the sake of avoiding complication, wirings for coupling to a power terminal of a pre-amplifier, a voltage terminal of a photodiode, and a terminal for a thermistor are respectively provided on the flexible printed circuit board 2.

As the main printed circuit board 5, a printed circuit board such as FR4 is used. As the capacitor elements 7, 8, 13 and 14, and the resistor elements 9 to 12, 1005-size chip parts are used.

As the post-amplifier 6, an automatic gain control (AGC) amplifier IC, an amplifier-equipped CDR (Crock and Data Recovery) IC or the like is used. The output of the post-amplifier 6 is omitted in the drawing.

In FIG. 2, the optical receiver sub-assembly 1 is configured by a photodiode element 101 and a pre-amplifier 102, and voltage is supplied from outside to a cathode terminal of the photodiode element 101. As the photodiode element 101, an avalanche photodiode is used. Since high receiver sensitivity can be obtained in the avalanche photodiode, it is preferable to achieve a receiver module for, particularly, long distance application.

The balanced-type circuit is configured from the differential output of the pre-amplifier 102 to the input of the post-amplifier 6. The transmission lines 3 and 4 have a characteristic impedance of 50Ω, respectively, however, the distance between the transmission lines 3 and 4 may be shortened to be coupled to each other, thereby forming coupled lines having a differential impedance of 100Ω. The capacitance values of the DC cut capacitor elements 7 and 8 are satisfactory if the values are sufficiently large, and are set at 1 µF (microfarad), respectively, in this case. A frequency characteristic compensating circuit 103 is configured by the balanced-type attenuator circuit and the parallel-connected capacitors. The resistance values of the resistor elements 9, 10, 11, and 12 configuring the balanced-type attenuator circuit are selected such that a desired attenuation can be realized, and are set at 390Ω(ohm), 33Ω, 33Ω, and 390Ω, respectively. The capacitance values of the parallel-connected capacitor elements (capacitors) 13 and 14 are adjusted such that a desired compensation characteristic can be obtained, and are set at 1.2 pF, respectively, in this case.

It should be noted that the characteristic of the frequency characteristic compensating circuit (FIGS. 3A and 3B) is obtained first so as to represent a small signal gain (S21) characteristic of FIG. 4B to be described later, and then the respective resistance values and capacitance values are calculated by simulation so as to represent the characteristic of FIG. 3.

The characteristic of the frequency characteristic compensating circuit 103 will be described by using FIGS. 3A and 3B. FIGS. 3A and 3B show the small signal gain characteristic (S21) and an output reflection characteristic (S22), respectively. By using the parallel-connected capacitor elements 13 and 14 each having a capacitance value of 1.2 pF, there can be obtained a characteristic that the gain is increased by about 3 dB from DC to 6 GHz in the small signal gain characteristic of FIG. 3A. Further, the output reflection characteristic of FIG. 3B shows a good characteristic of −13 dB or less in a frequency range from DC to 10 GHz.

The effects of Example 1 will be described by using FIGS. 4A and 4B. FIG. 4A shows the small signal gain (S21) characteristic from a light input portion of the optical receiver sub-assembly to immediately before the frequency characteristic compensating circuit 103. On the other hand, FIG. 4B shows the small signal gain (S21) characteristic from the light input portion of the optical receiver sub-assembly to an input portion of the post pre-amplifier that follows the frequency characteristic compensating circuit 103. By including the frequency characteristic compensating circuit 103, the S21 characteristic is improved to +0.3 dB from −2 dB from DC to 5 GHz. In addition, there is shown a good characteristic in which the 3 dB bandwidth characteristic occurs at 11 GHz or more. In the small signal gain characteristic of FIG. 4B, the gain from 4 to 8 GHz is larger than that at DC by about 0.5 dB. By adjusting the characteristic as descried-above, the deterioration of SRS can be prevented.

According to these characteristics, a preferable receiver can be realized in application to optical transceivers with a bit rate of approximately 10 Gbits/s. Here, the optical transceivers with a bit rate of approximately 10 Gbits/s include, but not limited to, the SONET specification with bit rates of 9.95 Gbits/s, 10.7 Gbits/s, and 11.1 Gbits/s and the 10 Gbit Eather specification with bit rates of 10.3 Gbits/s and 11.3 Gbits/s.

According to Example 1, even in the case where the amount of in-band gain reduction in the optical receiver sub-assembly 1 is changed, the characteristics of the frequency characteristic compensating circuit 103 can be easily adjusted by changing the capacitance values of the parallel-connected capacitor elements 13 and 14 on the main printed circuit board 5, thereby obtaining substantially the same optical reception characteristic. Accordingly, a plurality of kinds of optical receiver assemblies that are different from each other in characteristics can be used without changing the main printed circuit board layout in the optical receiver, and it is effective in stability of manufacturing optical receiver assemblies by a plurality of vendors and in reduction of manufacturing costs.

In the above-described example, the optical receiver sub-assembly 1 employs the CAN-type metal package case, however, the case may be, for example, a box-shaped package case using ceramic without limiting thereto. Further, an optical receiver module with a pigtail fiber may be utilized in place of the optical receiver sub-assembly 1. Furthermore, a PIN photodiode may be utilized in place of the avalanche photodiode. These modified examples are common in Example 2.

In addition, the balanced-type attenuator circuit is configured by the chip part resistor elements 9, 10, 11, and 12, however, the balanced-type attenuator circuit may be further downsized as a circuit module in which the resistor elements 9, 10, 11, and 12 are integrated on a ceramic printed circuit board by thick-film formation or thin-film formation. Alternatively, the balanced-type attenuator circuit may be configured by two unbalanced π-type attenuators of the chip type that are commercially available.

EXAMPLE 2

Figure 5:
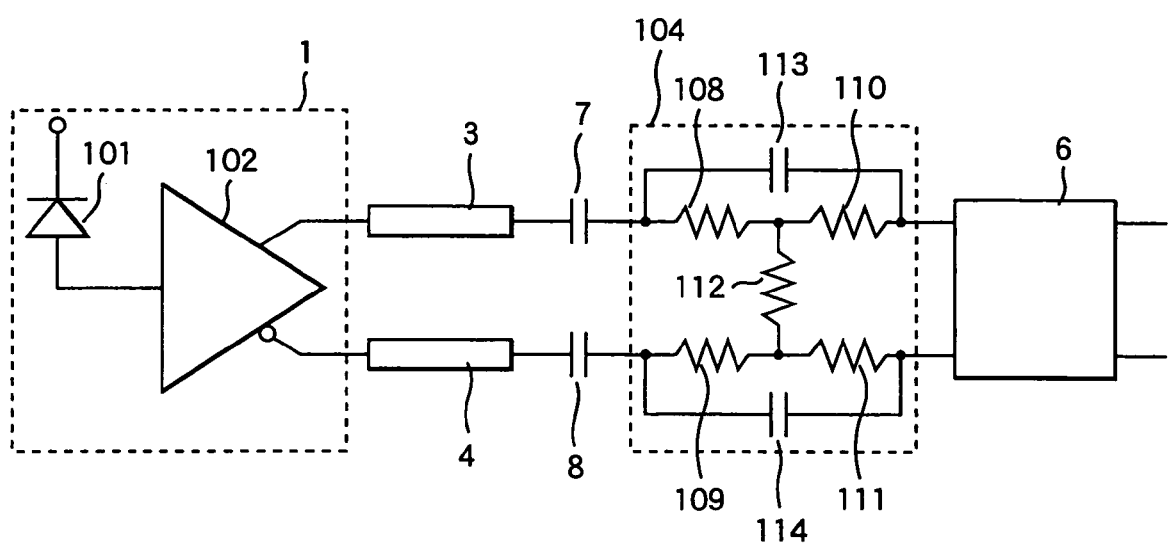
FIG. 5 is a circuit diagram for explaining an optical receiver from a photodiode to a post-amplifier.

Example 2 will be described with reference to FIG. 5. FIG. 5 is a circuit diagram for explaining an optical receiver from a photodiode to a post-amplifier.

Example 2 differs from Example 1 in that a frequency characteristic compensating circuit 104 is configured by a balanced H-type attenuator circuit and parallel-connected capacitor elements 113 and 114. The resistance values of resistor elements 108, 109, 110, 111, and 112 configuring the balanced H-type attenuator circuit are selected such that desired attenuation can be realized, and are set at 15Ω, 15Ω, 15Ω, 15Ω and 180Ω, respectively. The capacitance values of the parallel-connected capacitor elements 113 and 114 are adjusted such that a desired compensation characteristic can be obtained, and are set at 1.2 pF, respectively, in this case.

It should be noted that the balanced-type attenuator circuit and the balanced H-type attenuator circuit can be exchanged for each other. The balanced H-type attenuator circuit having the above-described resistance values is given the same attenuation as that of the balanced-type attenuator circuit having the respective resistance values in Example 1. Therefore, the frequency characteristic compensating circuit 104 in Example 2 has the same characteristic as that of the frequency characteristic compensating circuit 103 shown in FIG. 3. As a result, the effects of Example 2 are as shown in FIG. 4.

In Example 2, the balanced H-type attenuator circuit may be configured by chip part resistors, a circuit module in which the chip part resistors are integrated on a ceramic printed circuit board by thick-film formation or thin-film formation, or two unbalanced T-type attenuators of the chip type.

According to the present invention, it is possible to obtain an optical receiver that can achieve a good reception characteristic.

We claim:

1. An optical receiver comprising:
    an optical receiver sub-assembly including a light receiving element for converting an optical signal into an electrical signal and a first amplifier for amplifying an output signal from the light receiving element; and
    a main printed circuit board mounting a second amplifier for further amplifying an output from said first amplifier,
    wherein said optical receiver sub-assembly and said main printed circuit board are connected through a flexible printed circuit board for transmitting the electrical signal amplified by said first amplifier,
    wherein said first amplifier has a pair of differential output terminals and said second amplifier has a pair of differential input terminals,
    wherein said flexible printed circuit board includes two micro-strip lines for transmitting differential signals from the first amplifier to the second amplifier,
    wherein said main printed circuit board includes a pair of signal lines for the differential signals, the pair of signal lines connecting a flexible printed circuit board connected portion and said second amplifier,
    wherein said pair of signal lines includes two DC cut capacitors and a frequency characteristic compensating circuit,
    wherein said frequency characteristic compensating circuit consists of passive elements, including resistors forming a balanced attenuator circuit, and two capacitors each of which connects an input and an output of the balanced attenuator circuit, and
    wherein said frequency characteristic compensating circuit maintains an output reflection characteristic to be −10 dB or less in a frequency range from DC to 10 GHz.

2. The optical receiver according to claim 1,
    wherein said balanced attenuator circuit includes first, second, third, and fourth resistors, the first and second resistors are inserted into the signal lines, respectively, the third resister connects inputs of the balanced attenuator circuit, and the fourth resister connects outputs of the balanced attenuator circuit, and wherein resistances of the first and second resisters are the same as each other, and capacitances of the two capacitors are the same as each other.

3. The optical receiver according to claim 1, wherein said balanced attenuator circuit includes serially-connected first and second resistors and serially-connected third and fourth resistors being inserted in the signal lines, respectively, and a fifth resister connected between a connecting node of the first and second resistors and a connecting node of the third and fourth resistors, and wherein resistances of the first to fourth resisters are the same as each other, and capacitances of the two capacitors are the same as each other.

4. The optical receiver according to claim 1, wherein said frequency characteristic compensating circuit maintains the output reflection characteristic to be −13 dB or less in the frequency range from DC to 10 GHz.

* * * * *